United States Patent
Huang et al.

(10) Patent No.: US 9,691,641 B2
(45) Date of Patent: Jun. 27, 2017

(54) APPARATUS AND METHOD OF CLEANING WAFERS

(71) Applicants: Chia-Hung Huang, Hsinchu (TW); Jeng-Jyi Hwang, Chu-Tong Town (TW); Chi-Ming Yang, Hsinchu (TW)

(72) Inventors: Chia-Hung Huang, Hsinchu (TW); Jeng-Jyi Hwang, Chu-Tong Town (TW); Chi-Ming Yang, Hsinchu (TW)

(73) Assignee: Taiwan Semiconductor Manufacturing Co., Ltd., Hsin-Chu (TW)

( * ) Notice: Subject to any disclaimer, the term of this patent is extended or adjusted under 35 U.S.C. 154(b) by 882 days.

(21) Appl. No.: 13/713,007

(22) Filed: Dec. 13, 2012

(65) Prior Publication Data

US 2014/0166055 A1 Jun. 19, 2014

(51) Int. Cl.
| B08B 3/04 | (2006.01) |
| H01L 21/67 | (2006.01) |
| C11D 11/00 | (2006.01) |
| H01L 21/687 | (2006.01) |

(52) U.S. Cl.
CPC .......... *H01L 21/67051* (2013.01); *B08B 3/04* (2013.01); *C11D 11/0047* (2013.01); *H01L 21/68764* (2013.01); *H01L 21/68771* (2013.01)

(58) Field of Classification Search
CPC ......... H01L 21/67051; H01L 21/68764; H01L 21/68771; B08B 3/02; B08B 3/04; C11D 11/0047; Y10S 134/902
USPC ....................... 134/157, 25.1, 153
See application file for complete search history.

(56) References Cited

U.S. PATENT DOCUMENTS

| 5,954,877 A * | 9/1999 | Hayes ............... B05B 1/265 |
| | | 118/300 |
| 6,334,902 B1 * | 1/2002 | Mertens ........... H01L 21/67028 |
| | | 134/1 |
| 6,609,529 B2 * | 8/2003 | Olim ..................... G11B 5/41 |
| | | 134/149 |
| 6,998,392 B2 | 2/2006 | Clandinin et al. |
| 7,237,561 B2 | 7/2007 | Park et al. |
| 7,582,168 B2 | 9/2009 | Kato |
| | (Continued) | |

FOREIGN PATENT DOCUMENTS

| CN | 1440550 A | 9/2003 |
| JP | 2004-055916 A | 2/2004 |
| (Continued) | | |

OTHER PUBLICATIONS

Official Action issued Aug. 4, 2014 in counterpart KR patent application No. KR-10-2013-0019727.
(Continued)

*Primary Examiner* — Katelyn Whatley
(74) *Attorney, Agent, or Firm* — Duane Morris LLP

(57) ABSTRACT

An apparatus for cleaning wafers includes a chamber, a rotatable substrate holder inside the chamber, a nozzle above the rotatable substrate holder, a cover facing downward and fluidly coupled with the nozzle. The rotatable substrate holder is configured to mount one or more semiconductor wafers on the rotatable substrate holder. The nozzle is configured to spray a cleaning medium onto the one or more semiconductor wafers. The cover is of a shape having a top edge with a top cross-sectional area and a bottom edge with a bottom cross-sectional area.

18 Claims, 10 Drawing Sheets

(56) References Cited

U.S. PATENT DOCUMENTS

| | | | |
|---|---|---|---|
| 7,781,408 B2 | 8/2010 | Clandinin et al. | |
| 2001/0024767 A1 | 9/2001 | Toshima et al. | |
| 2001/0050831 A1 | 12/2001 | Olim | |
| 2002/0007844 A1* | 1/2002 | Orii | B08B 3/02 134/30 |
| 2006/0266387 A1 | 11/2006 | Verhaverbeke et al. | |
| 2008/0008834 A1* | 1/2008 | Collins | H01L 21/67051 427/282 |
| 2008/0017222 A1* | 1/2008 | Miya | H01L 21/67051 134/21 |

FOREIGN PATENT DOCUMENTS

| | | | | |
|---|---|---|---|---|
| KR | 2001-0091978 | | 10/2001 | |
| KR | 2007-0084697 | | 8/2007 | |
| KR | 2011-0006374 A | | 1/2011 | |
| KR | 20110006374 U | * | 6/2011 | |
| WO | WO 2009049020 A2 | * | 4/2009 | ....... C23C 16/45508 |

OTHER PUBLICATIONS

Official Action issued Jul. 8, 2015 in counterpart KR patent application No. 10-2015-0081941.

McCurdie, M.P., Paper on "Cleaning RMA Flux Residues in a High Lead Wafer Bumping Process", Agilent Technlogies, Fort Collins, Colorado, 7 pages.

Official Action issued Jan. 25, 2016 in counterpart Korean Patent Application No. 10-2015-0081941.

* cited by examiner

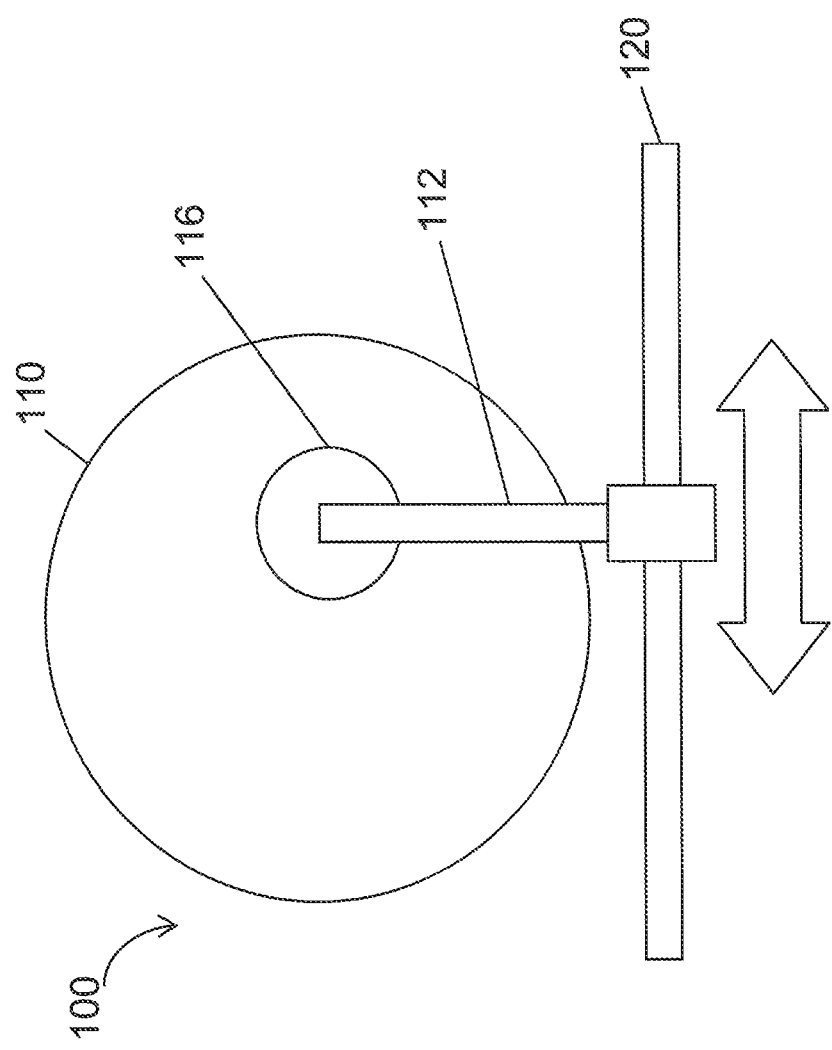

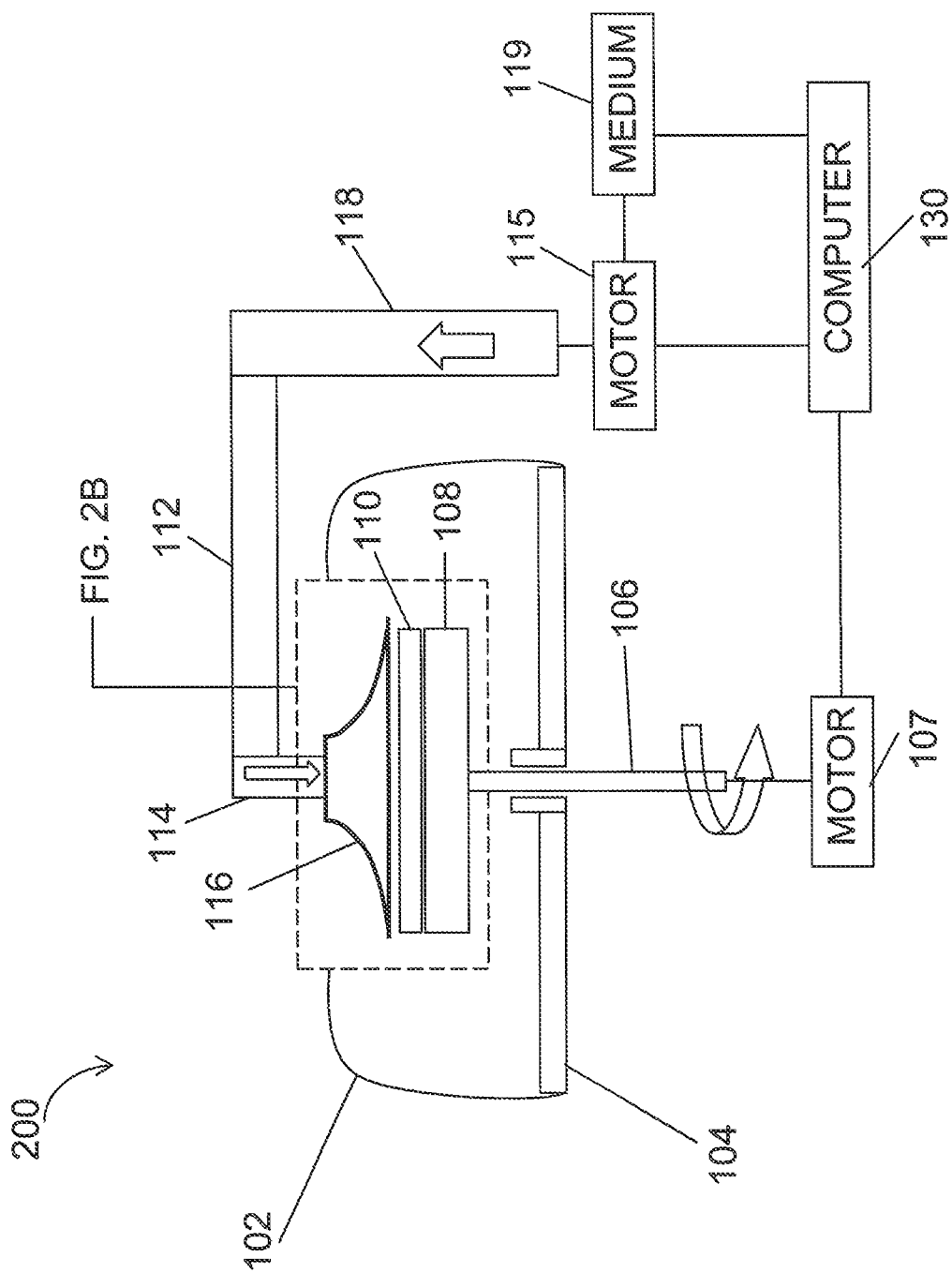

APPARATUS AND METHOD OF CLEANING WAFERS

FIELD

The disclosed apparatus and method relate to semiconductor processing. More particularly, the disclosed subject matter relates to an apparatus and a method of cleaning one or more semiconductor wafers.

BACKGROUND

Integrated circuits ("ICs") are incorporated into many electronic devices. IC packaging has evolved, such that multiple ICs may be vertically stacked in so-called three-dimensional ("3D") packages in order to save horizontal area on a printed circuit board ("PCB"). An alternative packaging technique, referred to as a 2.5D package may use an interposer, which may be formed from a semiconductor material such as silicon, for coupling one or more dies to a substrate. A plurality of IC chips, which may be of heterogeneous technologies, are mounted on the interposer. Connections among the various ICs are routed through conductive patterns in the interposer. These interposer and stacked IC techniques are called 2.5D-IC and 3D-IC, respectively. These packages are sometimes collectively referred to as "3D-IC."

When IC chips are mounted onto an interposer wafer (before singulating the wafer), a flux generally comprising organic chemicals is applied onto the wafer before solder bumps are applied. The flux improves bump morphology during a solder bump reflow process. After the reflow process and before further packaging steps such as applying underfill, flux residues, particularly those in the narrow gaps between the chips and the wafer, are completely cleaned off. The flux residues can deteriorate package reliability and eventually performance of resulting devices. For example, flux residue comprising carboxylic acid can cause corrosion of the solder bumps.

BRIEF DESCRIPTION OF THE DRAWINGS

The present disclosure is best understood from the following detailed description when read in conjunction with the accompanying drawings. It is emphasized that, according to common practice, the various features of the drawings are not necessarily to scale. On the contrary, the dimensions of the various features are arbitrarily expanded or reduced for clarity. Like reference numerals denote like features throughout specification and drawings.

FIG. 1B illustrates a top-down view of a portion of the apparatus shown in FIG. 1A.

FIG. 2A is a schematic cross-sectional view of an exemplary apparatus in which the bottom cross-sectional area of a cover at the bottom edge has a size not smaller than the size of a rotatable substrate holder, in accordance with some embodiments.

DETAILED DESCRIPTION

Figure 1A:
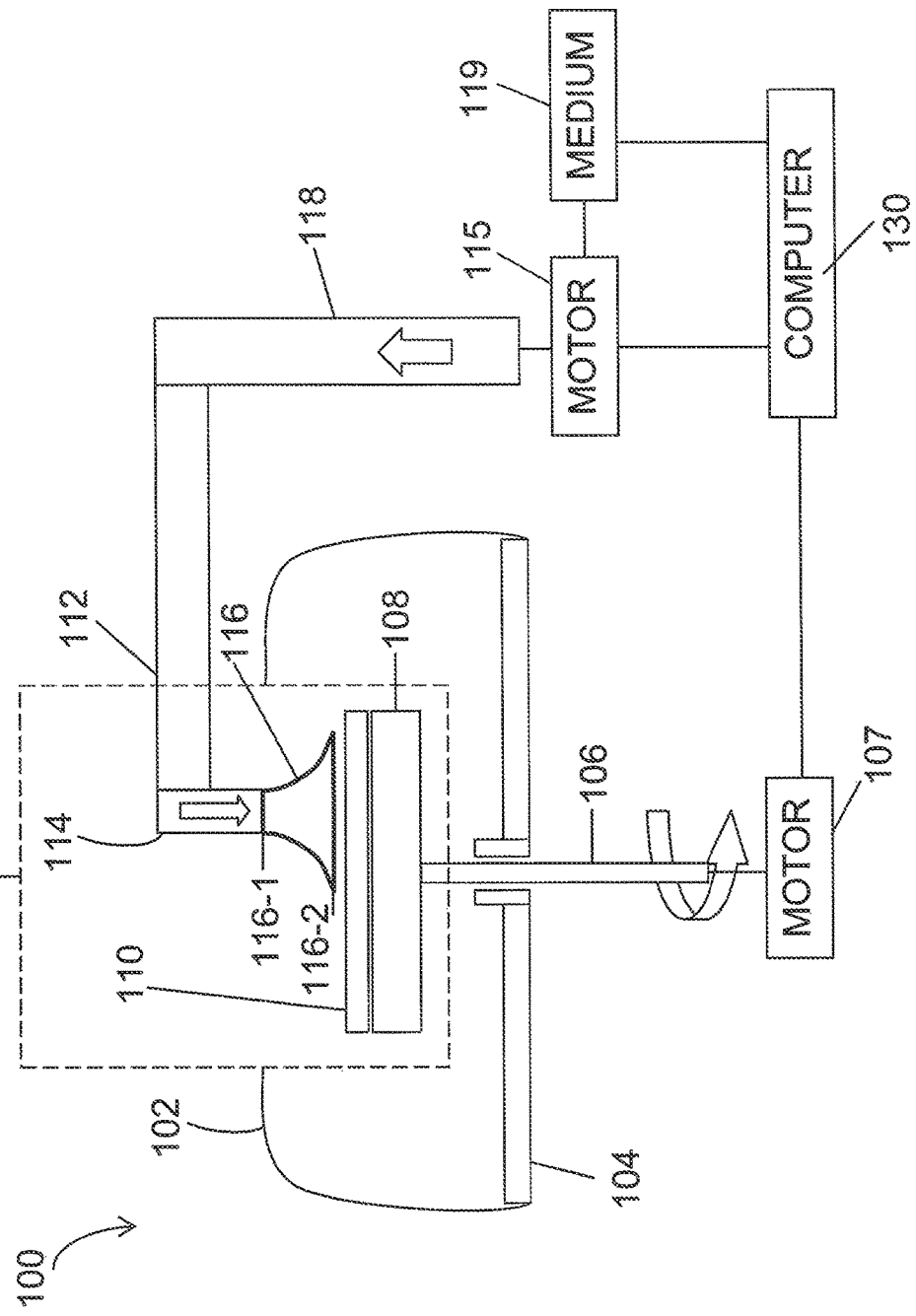
FIG. 1A is a schematic cross-sectional view of an exemplary apparatus in which the bottom cross-sectional area of a cover at the bottom edge has a size smaller than the size of a rotatable substrate holder, in accordance with some embodiments.

This description of the exemplary embodiments is intended to be read in connection with the accompanying drawings, which are to be considered part of the entire written description. In the description, relative terms such as "lower," "upper," "horizontal," "vertical,", "above," "below," "up," "down," "top" and "bottom" as well as derivative thereof (e.g., "horizontally," "downwardly," "upwardly," etc.) should be construed to refer to the orientation as then described or as shown in the drawing under discussion. These relative terms are for convenience of description and do not require that the apparatus be constructed or operated in a particular orientation. Terms concerning attachments, coupling and the like, such as "connected" and "interconnected," refer to a relationship wherein structures are secured or attached to one another either directly or indirectly through intervening structures, as well as both movable or rigid attachments or relationships, unless expressly described otherwise.

The present disclosure provides an apparatus and a method for cleaning a substrate such as a semiconductor wafer. Examples of a semiconductor wafer include but are not limited to a wafer having at least one integrated circuit bonded thereto through a plurality of solder bumps or microbumps (collectively referred to below as "bumps"). For example, such a wafer can be an interposer for three-dimensional integrated circuit (3D-IC) including 2.5D-IC structures. A flux comprising organic chemicals is generally used before solder bumps are applied in a 3D-IC fabrication process. After reflow of solder bumps, flux residues are left in narrow gaps between the semiconductor wafer and integrated circuits (chips). It is desirable to completely remove flux residues through a cleaning process. This disclosure provides an apparatus and a method for cleaning a semiconductor wafer in accordance with some embodiments described below.

Figure 3A:
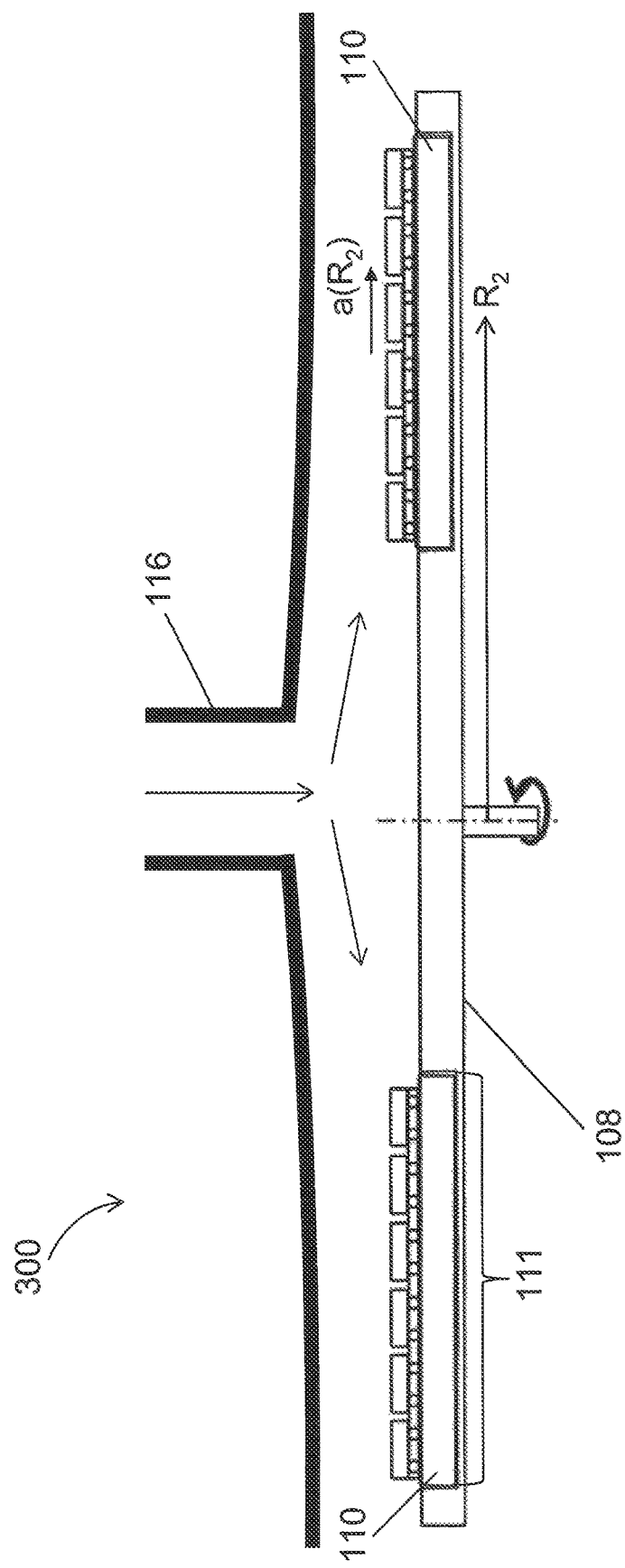
FIG. 3A is a schematic cross-sectional view of an exemplary apparatus in which the bottom cross-sectional area of a cover has a size not smaller than the size of a rotatable substrate holder, and the rotatable substrate holder has a size at least large enough to hold two or more semiconductor wafers, in accordance with some embodiments.
Figure 3B:
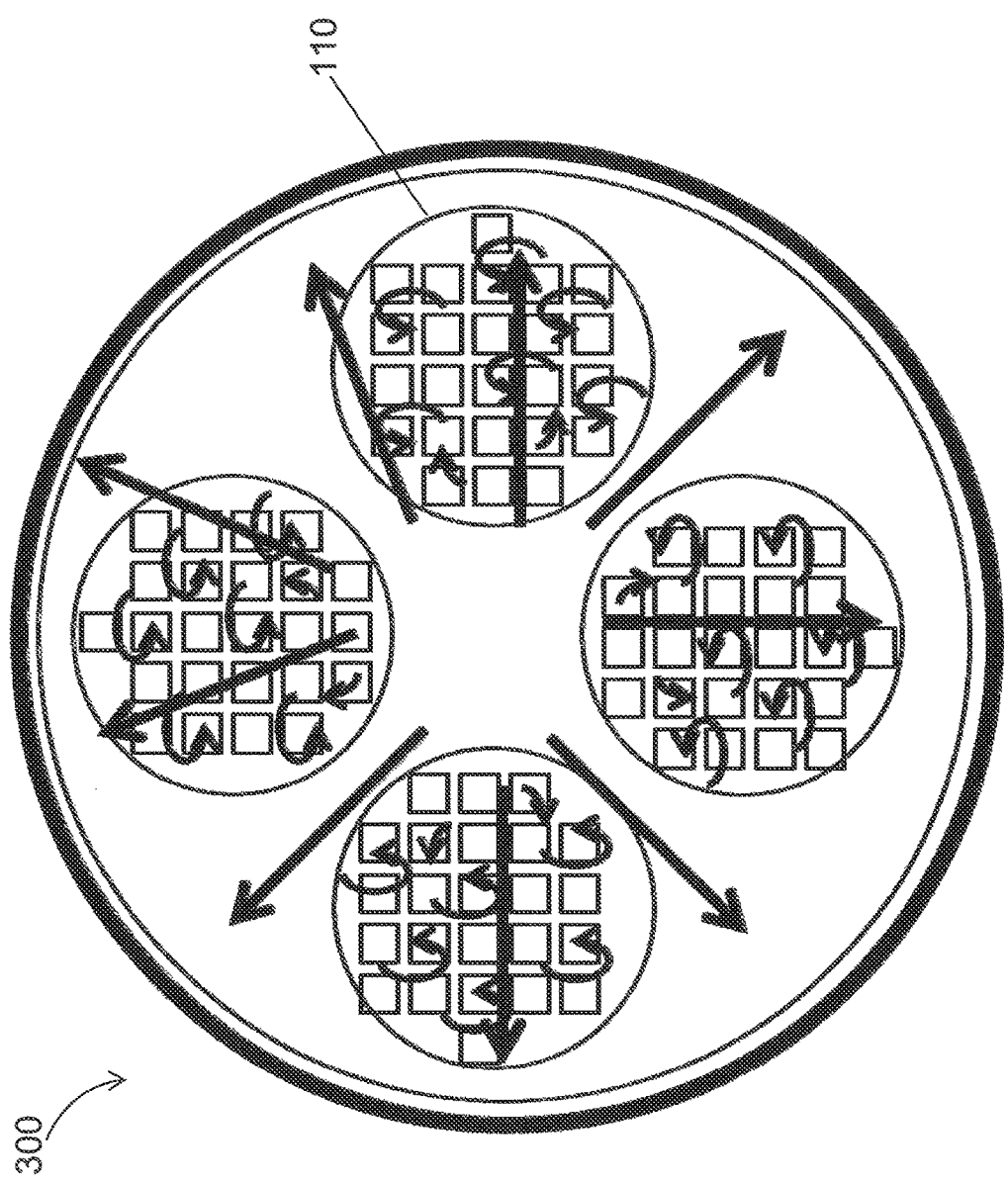
FIG. 3B is a top down view illustrating an exemplary configuration of the ratable substrate in the apparatus of FIG. 3A, in accordance with some embodiments.
Figure 4:
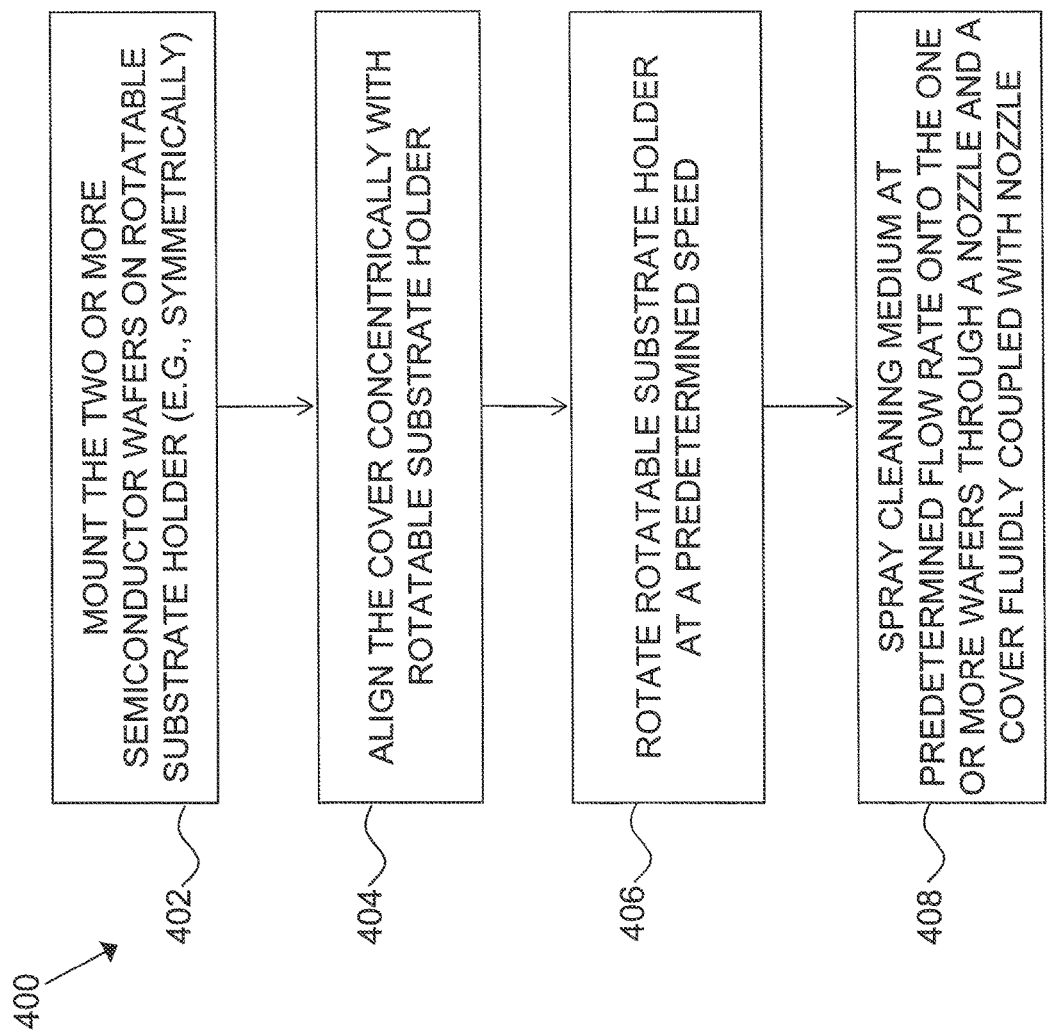
FIG. 4 is a flow chart illustrating an exemplary method in accordance with some embodiments.
Figure 5:
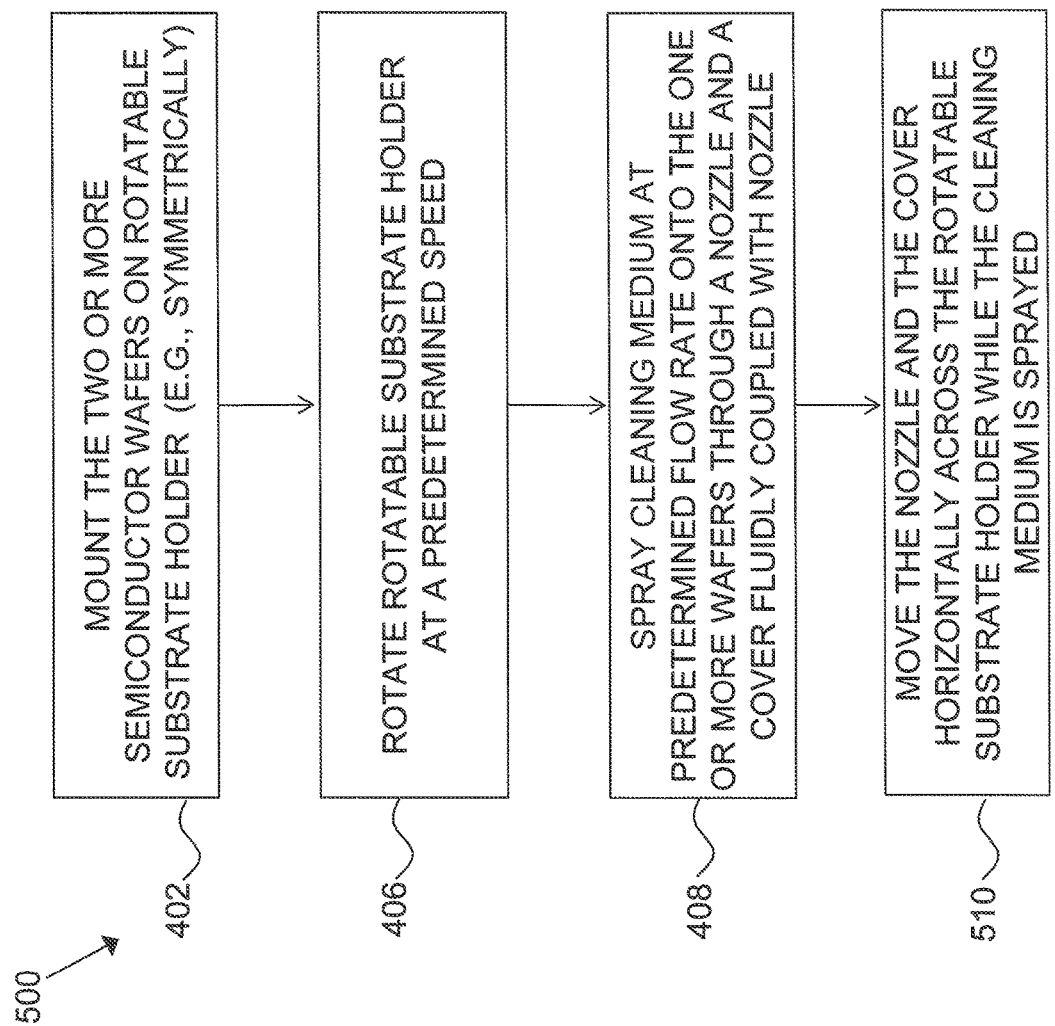
FIG. 5 is a flow chart illustrating another exemplary method comprising moving a nozzle and a cover horizontally across the rotatable substrate holder, in accordance with some embodiments.

In FIGS. 1A-3C, 4 and 5, like items or steps are indicated by like reference numerals unless expressly indicated otherwise, and for brevity, descriptions of the structure or step once described, are not repeated. The methods described in FIGS. 4-5, are described with reference to the exemplary apparatus described in FIG. 1A-3C.

Referring to FIG. 1A, an exemplary apparatus 100 comprises a chamber 102, a rotatable substrate holder 104 inside chamber 102, a nozzle 114 above rotatable substrate holder 104, a cover 116 facing downward and fluidly coupled with nozzle 114. Rotatable substrate holder 108 is configured to mount one or more semiconductor wafers 110 thereon. In some embodiments, each of the one or more semiconductor wafers 110 contains a plurality of chips. Rotatable substrate holder 108 is configured to hold the one or more semiconductor wafers 110 in a suitable mechanism, for example, through an electrostatic chuck, vacuum, clips, or a circular cavity on rotatable substrate holder 108. Rotatable substrate holder 108 is connected with a motor 107 through a shaft 106. In some embodiments, motor 107 is configured to rotate the rotatable substrate holder 108 at a predetermined speed. For example, the rotation speed can be in the range of from 1000 rpm to 2000 rpm. Nozzle 114 is configured to provide a cleaning medium 119 onto the one or more semiconductor wafers 108. In some embodiments, nozzle 114 is configured to spray cleaning medium 119 onto the one or more semiconductor wafers 108. Cleaning liquid medium 119 can be at certain pressure, for example, in the range of from 0.5 MPa to 1 MPa in some embodiments. Cover 116 has a shape having a top edge 116-1 with a top cross-sectional area and a bottom edge 116-2 with a bottom cross-sectional area. In some embodiments, both the top edge 116-1 and the bottom edge 116-2 of cover 116 are circular, and the bottom edge 116-2 is larger than the top edge 116-1.

In some embodiments, as shown in the exemplary apparatus 100 of FIG. 1A, the bottom cross-sectional area of a cover 116 at the bottom edge 116-2 has a size smaller than the size of rotatable substrate holder 108. Nozzle 114 and cover 116 are coupled with an arm 112, and arm 112 is configured to move nozzle 114 and cover 116 horizontally across rotatable substrate holder 108. As shown in a top plan view in FIG. 1B, the size of rotatable substrate holder 108 is larger than the bottom cross-sectional area of cover 116. Arm 112 coupled with nozzle 114 and cover 116 can be connected on a horizontal supporting beam 120 (shown in FIG. 1B) and a vertical supporting beam 118 (shown in FIG. 1A), and can be configured to move freely above rotatable substrate holder 108. As illustrated in FIG. 1A, nozzle 114, arm 112 and, optionally, vertical supporting beam 118 or horizontal supporting beam 120 can be connected with a motor 115. In some embodiments, nozzle 114 and cover 116 can be configured to rotate or move vertically.

Apparatus 100 can also comprise a supply of cleaning medium 119 which is fluidly coupled with nozzle 114. In some embodiments, nozzle 114 can be connected with a motor 326 and actuator (not shown) for such movement and spraying as described. Examples of a suitable cleaning medium 119 include, but are not limited to, filtered deionized water or ultra-pure water. In some embodiments, a suitable spray cleaning medium 119 can optionally comprise a surfactant, a solvent (e.g., isopropyl alcohol) or other suitable chemical. Cleaning medium 119 is filtered at 0.1 micron or less, for example at 50 nm, to remove any possible particulate contamination.

Suitable materials for nozzle 114, cover 116 and rotatable substrate holder 108 are not limited to any particular material type. Examples of a suitable material for either nozzle 114 or cover 116 include, but are not limited to, a fluoroplastic such as polytetrafluoroethylene (PTFE), and any other engineering plastics such as polyether ether ketone (PEEK) and a ceramic. The materials can have good corrosion resistance to cleaning medium 119 and cause no contamination during a cleaning operation. In some embodiments, a suitable material for cover 116 is rigid, frictionless and corrosion resistant, for desirable confinement of liquid flow and control of flow rate and distribution beneath cover 116. In other embodiments, a flexible material is used for cover 116.

In some embodiments, a processor 130 such as a computer, controller, or embedded processor is connected to motor 107, motor 115 and supply of the cleaning medium 119, respectively. In some embodiments, processor 130 is a computer, microcontroller, or embedded processor (collectively referred to below as "computer"). Computer 130 is specially programmed to direct motor 107 to rotate the rotatable substrate holder 108 at a predetermined speed, and to direct motor 115 to move nozzle 114 and cover 116 in a predetermined pattern. Through computer 130, nozzle 114 is also configured to spray the cleaning medium 119 at predetermined rate or according to a predetermined profile of spraying rate.

Figure 1C:
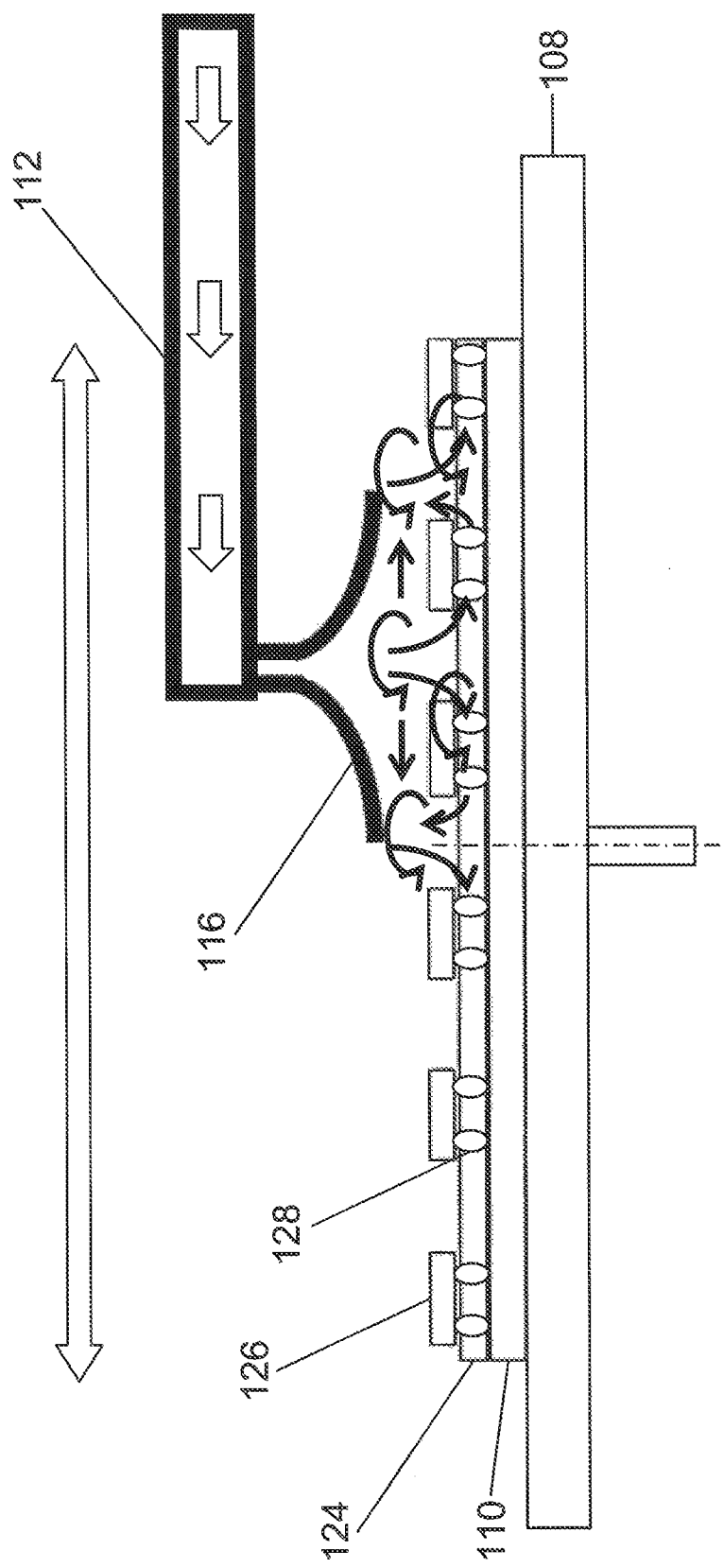
FIG. 1C is an enlarged detail of a portion of the apparatus shown in FIG. 1A.

FIG. 1C is an enlarged detail of a portion of apparatus 100 of FIG. 1A, and one or more semiconductor wafers 110 during a cleaning process. In some embodiments, each of the one or more semiconductor wafers 110 comprises at least one integrated circuit (IC) 126 bonded thereto through a plurality of solder bumps 128. In some embodiments, wafer 110 is comprises a plurality of semiconductor (e.g., silicon) interposers for three-dimensional integrated circuit (3D-IC) including 2.5D-IC structures. The ICs 126 are mounted to the interposers before singulating the wafer. An uncleaned wafer 110 can have flux residue 124 comprising organic chemicals, which are entrapped in narrow gaps between semiconductor wafer 110 and integrated circuits (chips) 126. The inventors have determined that flux reside 124 can be removed through a cleaning process on the apparatus in the present disclosure, through shear vortex, centrifugal force, and pressure difference of cleaning medium 119 between outside and inside narrow gaps under cover 116.

In some embodiments, rotatable substrate holder 108 has a size at least large enough to hold one semiconductor wafer 110. In some embodiments, the rotatable substrate holder 108 has a size at least large enough to hold two or more semiconductor wafers 110. Each semiconductor wafer 110 can have a plurality of chips. The wafer size is not limited to any size. For example, in some embodiments, a suitable size of a semiconductor wafer 110 is in the range of 200-450 mm. The size of a semiconductor wafer can be 200 mm, 300 mm or 450 mm.

Figure 2B:
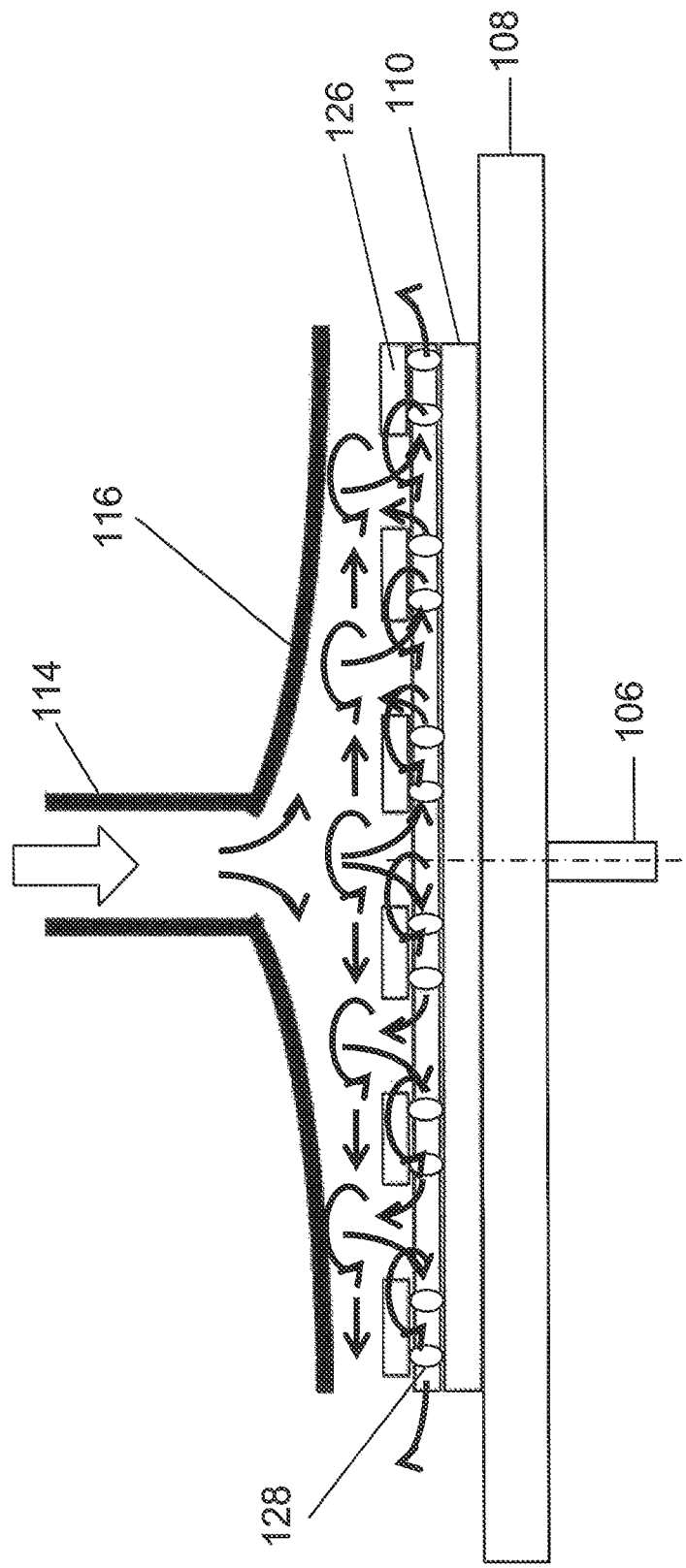
FIG. 2B is an enlarged detail of a portion of the apparatus shown in FIG. 2A.
Figure 2C:
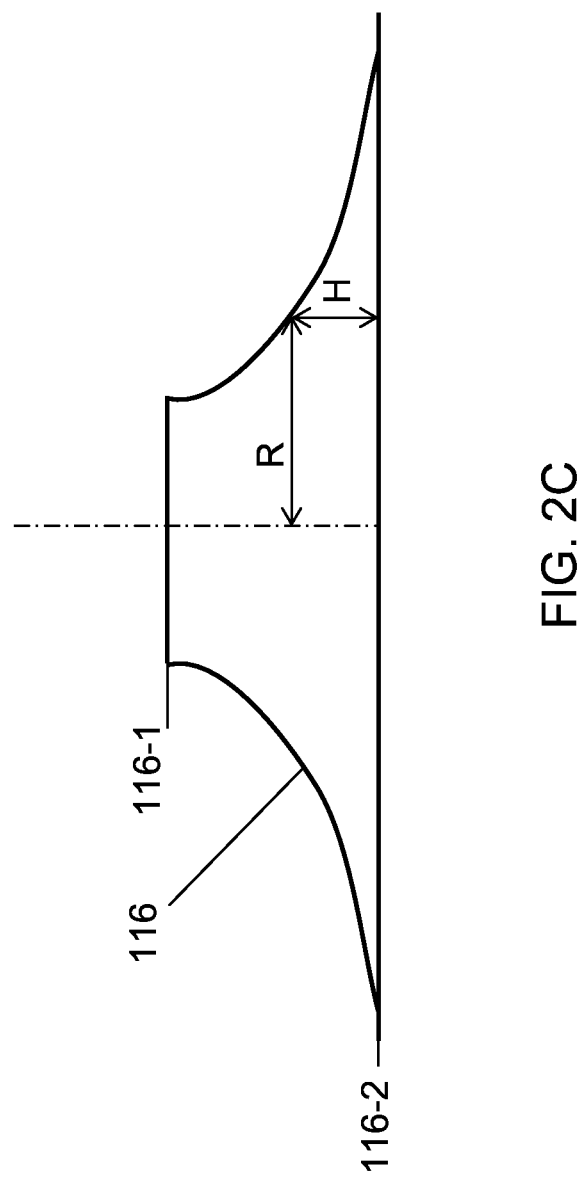
FIG. 2C illustrates the shape of an exemplary cover in accordance with some embodiments.

Referring to FIG. 2A illustrating an exemplary apparatus 200, the bottom cross-sectional area of a cover 116 at the bottom edge 116-2 has a size not smaller than the size of rotatable substrate holder 108, in accordance with some embodiments. FIG. 2B is an enlarged detail of a portion of apparatus 200 shown in FIG. 2A. FIG. 2C illustrates the shape of an exemplary cover 116 in accordance with some embodiments. In FIGS. 2A-2C, like items are indicated by like reference numerals, and for brevity, descriptions of the structure, provided above with reference to FIG. 1A-1C, are not repeated.

When the bottom cross-sectional area of a cover 116 at the bottom edge 116-2 has a size not smaller than the size of rotatable substrate holder 108, nozzle 114 and cover 116 cannot move horizontally in some embodiments. However, in some embodiments, nozzle 114 and cover 116 can be configured to rotate or move vertically. In some embodiments, the rotatable substrate holder 108 has a size at least large enough to hold one semiconductor wafer 110, as shown in FIG. 2B. In some embodiments, rotatable substrate holder 108 has a size at least large enough to hold two or more semiconductor wafers. In some embodiments, the rotatable substrate holder 108 has a circular shape and is large enough to hold the two or more semiconductor wafers 110 symmetrically around the axis of rotatable substrate holder 108 thereon; and the cover is aligned concentrically with rotatable substrate holder 108. The shape and dimension of cover 116 can be designed according to a recalculated profile comprising two parameters R (radius of cover 116 at a certain point) and H (height of cover 116 at the same point), as defined in FIG. 2C. For example, in some embodiments, R*H is a constant. The liquid volume flow rate equals to $2*\pi*R*H*v$, where "v" is the flow velocity of liquid cleaning medium at a point. In some embodiments, the liquid volume flow rate is constant. In some embodiments, nozzle 114 and cover 116 are configured to provide that v increases as R increases. In some embodiments, the cover 116 can be configured to be adjustable when used according to a profile comprising two parameters R and H.

Referring to FIG. 3A, an exemplary apparatus 300 is similar to apparatus 200 of FIG. 2A. In exemplary apparatus 300, the bottom cross-sectional area of a cover 116 at the bottom edge 116-2 has a size not smaller than the size of rotatable substrate holder 108, and rotatable substrate holder 108 has a size at least large enough to hold two or more semiconductor wafers 110, in accordance with some embodiments. Used for the purpose of illustration only, FIG. 3B is a top plan view of an exemplary configuration of the rotatable substrate 110 on rotatable substrate holder 108 in the apparatus 300 of FIG. 3A, in accordance with some embodiments. In some embodiments, rotatable substrate holder 108 has a circular shape and is large enough to hold the two or more semiconductor wafers 110 symmetrically on rotatable substrate holder 108; and the cover is aligned concentrically with rotatable substrate holder 108. Rotatable substrate holder 108 is configured to hold the two or more semiconductor wafers 110 in a suitable mechanism, for example, through clips (not shown), or a circular cavity 111 on rotatable substrate holder 108. As shown in FIG. 3A, the size of a circular cavity is the same as that of each of the two or more semiconductor wafers 110

FIG. 4 is a flow chart illustrating an exemplary method 400 for cleaning a substrate such as a semiconductor wafer in accordance with some embodiments. Before step 402, one or more uncleaned semiconductor wafers 110 can be optionally immersed in a cleaning medium 119 for a certain time interval, for example, 30 minutes. Examples of a suitable cleaning medium 119 include, but are not limited to, filtered deionized water or ultra-pure water. Cleaning medium 119 can optionally comprise a surfactant, a solvent or other suitable chemical. Cleaning medium 119 is filtered at 0.1 micron or less, for example at 50 nm, to remove any possible particulate contamination.

At step 402, one or more semiconductor wafers 110 are mounted onto a rotatable substrate holder 108 inside a chamber 102, in an apparatus as described in FIGS. 1A, 2A and 3A. As described, an exemplary apparatus 100 (200, or 300) comprises a chamber 102, a rotatable substrate holder 104 inside chamber 102, a nozzle 114 above rotatable substrate holder 104, a cover 116 facing downward and fluidly coupled with nozzle 114. In some embodiments, both the top edge 116-1 and the bottom edge 116-2 of the cover 116 have circular cross sections, and the bottom cross-sectional area of the bottom edge 116-2 is larger than the top cross-sectional area of the top edge 116-1.

In some embodiments, cover 116 at the bottom edge 116-2 has a size not smaller than the size of the rotatable substrate holder. The rotatable substrate holder 108 can have a size at least large enough to hold one semiconductor wafer 110. In some embodiments, the rotatable substrate holder 108 has a circular shape and is large enough to hold the two or more semiconductor wafers 110. The one semiconductor wafer 110 or the two or more semiconductor wafers are symmetrically mounted on rotatable substrate holder 108. In some embodiments, each of the one or more semiconductor wafers 110 comprises at least one integrated circuit 126 bonded thereto through a plurality of solder bumps 128. The one or more semiconductor wafers 110 comprise flux residue to be removed. In some embodiments, each the one or more semiconductor wafers 110 is an interposer for three-dimensional integrated circuit (3D-IC) including 2.5D-IC structures. In some embodiments, the one or more semiconductor wafers 110 comprises a plurality of chips.

Step 404 is an optional step, when cover 116 at the bottom edge 116-2 has a size not smaller than the size of the rotatable substrate holder 108. At step 404, cover 116 is aligned concentrically with rotatable substrate holder 108.

At step 406, rotatable substrate holder 108 is rotated through motor 107 at a predetermined speed, as described in FIG. 1A. In some embodiments, a processor 130 such as a computer, controller, or embedded processor can be used to control motor 107 connected to rotatable substrate holder 108. In some embodiments, rotatable substrate holder 108 is rotated according to a predetermined profile of rotation speed programmed on the processor 130 such as a computer or embedded processor.

At step 408 of FIG. 4, a cleaning medium 119 is sprayed at a predetermined flow rate onto the one or more semiconductor wafers 108, through nozzle 114 and cover 116 as described in FIGS. 1A, 2A and 3A. Cover 116 is fluidly coupled with nozzle 114. Cleaning medium 119 can be sprayed in a form of fog or mist or any other suitable form. In some embodiments, nozzle 114 and cover 116 can be configured to rotate or move vertically when cleaning medium 119 is sprayed. In some embodiments, cover 116 has a fixed configuration and dimension. In other embodiments, cover 116 has an adjustable configuration or dimension. The configuration or dimension can be optionally adjusted at step 408. In some embodiments, cleaning medium 119 is sprayed according to a predetermined profile of flow rate and time length, which can be programmed and stored on the processor 130 such as a computer or embedded processor.

After step 408, the one or more semiconductor wafers 110 can be rinsed with filtered deionized water, ultra-pure water, a solvent or combination thereof. The cleaned one or more semiconductor wafers 110 can be then dried and tested.

FIG. 5 is a flow chart illustrating another exemplary method 500 comprising moving a nozzle 114 and a cover 116 horizontally across the rotatable substrate holder 108, in accordance with some embodiments. In some embodiments, cover 116 has a shape having a top edge 116-1 with a top cross sectional area and a bottom edge 116-2 with a bottom cross sectional area. The exemplary method 500 can be used when cover 116 at the bottom edge 116-2 has a size smaller than the size of the rotatable substrate holder 108. Rotatable substrate holder 108 has a size at least large enough to hold one semiconductor wafer 110 in some embodiments, or two or more semiconductor wafer 110.

At step 502, one or more semiconductor wafers 110 are mounted onto a rotatable substrate holder 108 inside a chamber 102, as described in step 402 of FIG. 4. In some embodiments, cover 116 at the bottom edge 116-2 has a size smaller than the size of the rotatable substrate holder 108. So step 404 of FIG. 4 cannot be used. The location of cover 116 above rotatable holder 108 is not limited to any location horizontally.

At step 406, rotatable substrate holder 108 is rotated at a predetermined speed, as described in FIG. 4. At step 408, a cleaning medium 119 is sprayed at a predetermined flow rate onto the one or more semiconductor wafers 108, through nozzle 114 and cover 116, which is fluidly coupled with nozzle 114, as described in FIG. 4. As described, in some embodiments, cover 116 has a fixed configuration and dimension. In other embodiments, cover 116 has an adjustable configuration or dimension. The configuration or dimension can be optionally adjusted at step 408.

At step 510 of FIG. 5, nozzle 114 and cover 116 are moved horizontally across rotatable substrate holder 108 while cleaning medium 119 is sprayed. In some embodiments, nozzle 114 and cover 116 can be configured to rotate or move vertically when cleaning medium 119 is sprayed. In some embodiments, nozzle 114 and cover 116 are moved according to a predetermined profile of direction and direction, which can be programmed and stored on the processor 130 such as a computer or embedded processor.

After step 510, the one or more semiconductor wafers 110 can be rinsed, dried and tested as described in FIG. 4.

The present disclosure provides an apparatus and a method for cleaning a substrate such as a semiconductor wafer. In one aspect, the apparatus comprises a chamber, a rotatable substrate holder inside the chamber, a nozzle above the rotatable substrate holder, a cover facing downward and fluidly coupled with the nozzle. The rotatable substrate holder is configured to mount one or more semiconductor wafers thereon. The nozzle is configured to provide a cleaning medium onto the one or more semiconductor wafers. The cover is of a shape having a top edge and a bottom edge. In some embodiments, both the top edge and the bottom edge of the cover are circular, and the bottom edge is larger than the top edge.

In some embodiments, the bottom cross-sectional area of the cover at the bottom edge has a size smaller than the size of the rotatable substrate holder. The nozzle and the cover are coupled with an arm, and the arm is configured to move the nozzle and the cover horizontally across the rotatable substrate holder. In some embodiments, the rotatable substrate holder has a size at least large enough to hold one semiconductor wafer. In some embodiments, the rotatable substrate holder has a size at least large enough to hold two or more semiconductor wafers. In some embodiments, each of the one or more semiconductor wafers contains a plurality of chips.

In other embodiments, the bottom cross-sectional area of the cover at the bottom edge has a size not smaller than the size of the rotatable substrate holder. The rotatable substrate holder has a size at least large enough to hold one semiconductor wafer in some embodiments, or two or more semiconductor wafers in other embodiments. In some embodiments, the rotatable substrate holder has a circular shape and is large enough to hold the two or more semiconductor wafers symmetrically on the rotatable substrate holder; and the cover is aligned concentrically with the rotatable substrate holder.

In another aspect, the present disclosure provides a method for cleaning a substrate such as a semiconductor wafer. In some embodiments, the method comprises the following steps: mounting one or more semiconductor wafers onto a rotatable substrate holder inside a chamber; rotating the rotatable substrate holder at a predetermined speed; and providing a cleaning medium at a predetermined flow rate onto the one or more semiconductor wafers, through a nozzle and a cove, which is fluidly coupled with the nozzle. In some embodiments, each of the one or more semiconductor wafers comprises at least one integrated circuit bonded thereto through a plurality of solder bumps. The one or more semiconductor wafers comprise flux residue to be removed.

In some embodiments, both the top edge and the bottom edge of the cover have circular cross sections, and the bottom cross-sectional area of the bottom edge is larger than the top cross-sectional area of the top edge. In some embodiments, the cover at the bottom edge has a size not smaller than the size of the rotatable substrate holder. The rotatable substrate holder can have a size at least large enough to hold one semiconductor wafer in some embodiments, or two or more semiconductor wafers in other embodiments. In some embodiments, the method further comprises mounting the two or more semiconductor wafers symmetrically on the rotatable substrate holder; and aligning the cover concentrically with the rotatable substrate holder.

In some embodiments, the method in the present disclosure comprises the following steps: mounting one or more semiconductor wafers onto a rotatable substrate holder inside a chamber; rotating the rotatable substrate holder at a predetermined speed; providing a cleaning medium at a predetermined flow rate onto the one or more semiconductor wafers, through a nozzle and a cover, moving the nozzle and the cover horizontally across the rotatable substrate holder while the cleaning medium is sprayed. The cover is fluidly coupled with the nozzle. The cover has a shape having a top edge with a top cross sectional area and a bottom edge with a bottom cross sectional area. In some embodiments, the bottom edge of the cover has a size smaller than the size of the rotatable substrate holder. The rotatable substrate holder has a size at least large enough to hold one semiconductor wafer in some embodiments, or two or more semiconductor wafers in other embodiments. In some embodiments, each of the one or more semiconductor wafers contains a plurality of chips.

Although the subject matter has been described in terms of exemplary embodiments, it is not limited thereto. Rather, the appended claims should be construed broadly, to include other variants and embodiments, which may be made by those skilled in the art.

What is claimed is:

1. An apparatus, comprising:
   a chamber;
   a rotatable substrate holder inside the chamber, configured to mount one or more semiconductor wafers thereon;
   a horizontal arm;
   a nozzle supplying a liquid cleaning medium, having a vertical axis, connected with the horizontal arm, and disposed above the rotatable substrate holder, configured to provide the cleaning medium onto the one or more semiconductor wafers; and
   a cover being rotatable, facing downward, fluidly coupled with the nozzle, the cover being of a shape having a top edge with a top cross-sectional area, a bottom edge with a bottom cross-sectional area and a wall between the top edge and the bottom edge,
   wherein the cover has a profile in which each point of the cover has a radius (R) from a vertical axis of the cover and a height (H) from the bottom cross-sectional area, and the product of R times H (R*H) is a constant; and
   wherein the cover is sized and shaped, in combination with rotation of the rotatable substrate holder or the cover, to provide that a velocity of the cleaning medium increases as R increases.

2. The apparatus of claim 1, wherein
   both the top edge and the bottom edge of the cover are circular, and the bottom edge is larger than the top edge.

3. The apparatus of claim 1, wherein
the bottom cross-sectional area of the cover at the bottom edge has a size smaller than the size of the rotatable substrate holder.

4. The apparatus of claim 3, wherein
the horizontal arm is configured to move the nozzle and the cover horizontally across the rotatable substrate holder.

5. The apparatus of claim 1, wherein each of the one or more semiconductor wafers contains a plurality of chips.

6. The apparatus of claim 4, wherein
the rotatable substrate holder has a size at least large enough to hold two or more semiconductor wafers.

7. The apparatus of claim 1, wherein
the bottom cross-sectional area of the cover at the bottom edge has a size not smaller than the size of the rotatable substrate holder.

8. The apparatus of claim 7, wherein
the rotatable substrate holder has a size at least large enough to hold two or more semiconductor wafers.

9. The apparatus of claim 8, wherein
the rotatable substrate holder has a circular shape and is large enough to hold the two or more semiconductor wafers symmetrically on the rotatable substrate holder; and
the cover is aligned concentrically with the rotatable substrate holder.

10. The apparatus of claim 1, wherein the cover and the nozzle are made of polytetrafluoroethylene (PTFE), polyether ether ketone (PEEK) or a ceramic.

11. The apparatus of claim 1, wherein the cover is made of polyether ether ketone (PEEK).

12. The apparatus of claim 1, wherein the top edge, the bottom edge and the wall define an open space so as to allow the cleaning medium to flow through the top cross-sectional area, the open space, and the entire bottom cross-sectional area.

13. An apparatus, comprising:
a chamber;
a rotatable substrate holder inside the chamber, configured to mount one or more semiconductor wafers thereon;
a horizontal arm;
a nozzle supplying a liquid cleaning medium, having a vertical axis, connected with the horizontal arm, and disposed above the rotatable substrate holder, configured to provide the cleaning medium onto the one or more semiconductor wafers; and
a cover being rotatable, facing downward, fluidly coupled with the nozzle, the cover being of a shape having a top edge with a top cross-sectional area, a bottom edge with a bottom cross-sectional area and a wall between the top edge and the bottom edge,
wherein the cover is made of polyether ether ketone (PEEK), both the top edge and the bottom edge of the cover are circular, and the top edge, the bottom edge and the wall define an open space so as to allow the cleaning medium to flow through the top cross-sectional area, the open space, and the entire bottom cross-sectional area;
wherein the cover has a profile in which each point of the cover has a radius (R) from a vertical axis of the cover and a height (H) from the bottom cross-sectional area, and the product of R times H (R*H) is a constant; and
wherein the cover is sized and shaped, in combination with rotation of the rotatable substrate holder or the cover, to provide that a velocity of the cleaning medium increases as R increases.

14. A method of cleaning one or more semiconductor wafers, comprising:
providing an apparatus including
a chamber;
a rotatable substrate holder inside the chamber, configured to mount the one or more semiconductor wafers thereon;
a horizontal arm;
a nozzle supplying a liquid cleaning medium, having a vertical axis, connected with the horizontal arm, and disposed above the rotatable substrate holder, configured to provide the cleaning medium onto the one or more semiconductor wafers; and
a cover being rotatable, facing downward, fluidly coupled with the nozzle, the cover being of a shape having a top edge with a top cross-sectional area, a bottom edge with a bottom cross-sectional area and a wall between the top edge and the bottom edge,
wherein the cover has a profile in which each point of the cover has a radius (R) from a vertical axis of the cover and a height (H) from the bottom cross-sectional area, and the product of R times H (R*H) is a constant;
mounting the one or more semiconductor wafers onto the rotatable substrate holder inside the chamber;
rotating the rotatable substrate holder or the cover at a predetermined speed; and
spraying the cleaning medium at a predetermined flow rate onto the one or more semiconductor wafers, through the nozzle and the cover,
wherein the cover, in combination with rotation of the rotatable substrate holder or the cover, provides that a velocity of the cleaning medium increases as R increases.

15. The method of claim 14, wherein
each of the one or more semiconductor wafers has at least one integrated circuit bonded thereto through a plurality of solder bumps; and
the one or more semiconductor wafers comprise flux residue to be removed.

16. The method of claim 14, wherein
both the top edge and the bottom edge of the cover have circular cross sections, and the bottom cross-sectional area of the bottom edge is larger than the top cross-sectional area of the top edge.

17. The method of claim 14, wherein
the cover at the bottom edge has a size not smaller than the size of the rotatable substrate holder.

18. The method of claim 14, wherein the rotatable substrate holder has a size at least large enough to hold two or more semiconductor wafers, the mounting the one or more semiconductor wafer comprises
mounting two or more semiconductor wafers symmetrically on the rotatable substrate holder; and
aligning the cover concentrically with the rotatable substrate holder.

* * * * *